United States Patent [19]

Naem et al.

[11] Patent Number: 5,807,759

[45] Date of Patent: Sep. 15, 1998

[54] METHOD OF FABRICATING A CONTACT STRUCTURE FOR A RAISED SOURCE/ DRAIN MOSFET

[75] Inventors: Abdalla Aly Naem, Sunnyvale; Mohsen Shenasa, Pleasanton, both of Calif.

[73] Assignee: National Semiconductor Corporation, Santa Clara, Calif.

[21] Appl. No.: 803,121

[22] Filed: Feb. 20, 1997

[51] Int. Cl.$^6$ .................................................. H01L 21/265
[52] U.S. Cl. ............................................. 437/44; 437/200
[58] Field of Search ............................... 437/44, 200, 41, 437/162

[56] References Cited

U.S. PATENT DOCUMENTS

| | | | |
|---|---|---|---|
| 5,030,584 | 7/1991 | Nakata | 437/44 |
| 5,168,072 | 12/1992 | Moslehi | 437/41 |
| 5,182,619 | 1/1993 | Pfiester | 257/382 |
| 5,571,744 | 11/1996 | Demirlioglu et al. | 437/57 |

OTHER PUBLICATIONS

C.T. Liu, et al., "MOSFET's with One–Mask Sealed Diffusion–Junctions for ULSI Applications", IEEE Electron Device Letters, vol. 16, No. 8, Aug. 1995.

T.M. Liu, et al., "An Ultra High Speed ECL–Bipolar CMOS Technology with Silicon Fillet Self–aligned Contacts", IEEE Symposium on VLSI Technology Digest of Technical Papers, pp. 30–31, 1992, Month Unknown.

T.M. Liu, et al., "A Half–micron Super Self–aligned BiCMOS Technology for High Speed Applications", IEEE, pp. 2.2.1–2.2.4, 1992, Month Unknown.

T.M. Liu, et al., "The Control of Polysilicon/Silicon Interface Processed by Rapid Thermal Anneal", IEEE, pp. 263–266, 1991, Month Unknown.

Tzu–Yin Chiu, et al., "Non–overlapping Super Self–Aligned BiCMOS with 87ps Low Power ECL", IEEE, pp. 752–755, 1988.

*Primary Examiner*—John Niebling
*Assistant Examiner*—Richard A. Booth
*Attorney, Agent, or Firm*—Limbach & Limbach L.L.P.

[57] ABSTRACT

A method of fabricating a MOSFET device structure, wherein the MOSFET device structure includes field oxide regions, a layer of gate oxide formed on the substrate, oxide sidewall spacers formed on sidewalls of the polysilicon gate, and LDD N– regions formed in the substrate adjacent the field oxide regions and beneath the sidewall spacers. A second layer of polysilicon is deposited over the above-described structure and a chemical mechanical polishing step is performed to self-align the polysilicon source/drain regions to the LDD N– substrate regions. N+ type dopant is then implanted into the gate poly and into the raised source/drain polysilicon regions. Next, a rapid thermal anneal step is performed to activate the N+ implant and to outdiffuse the N+ dopant from the polysilicon raised source/drain regions to form an N+ junction inside the N– LDD source/drain regions. A salicide oxide exclusion mask is then formed to protect the structure with the exception of the polysilicon raised source/drain regions and the polysilicon gate. An amorphization using heavy ion species is then performed to amorphize the surfaces of the gate/source/drain poly regions. A titanium film is then sputter deposited over the entire structure to form the first salicide phase in-situ. Unreacted titanium is then removed using a conventional wet etch and a dielectric layer is deposited and chemically mechanically polished to planarize the structure. The formation of the final titanium salicide phase is performed simultaneously with the densification of the dielectric layer.

2 Claims, 7 Drawing Sheets

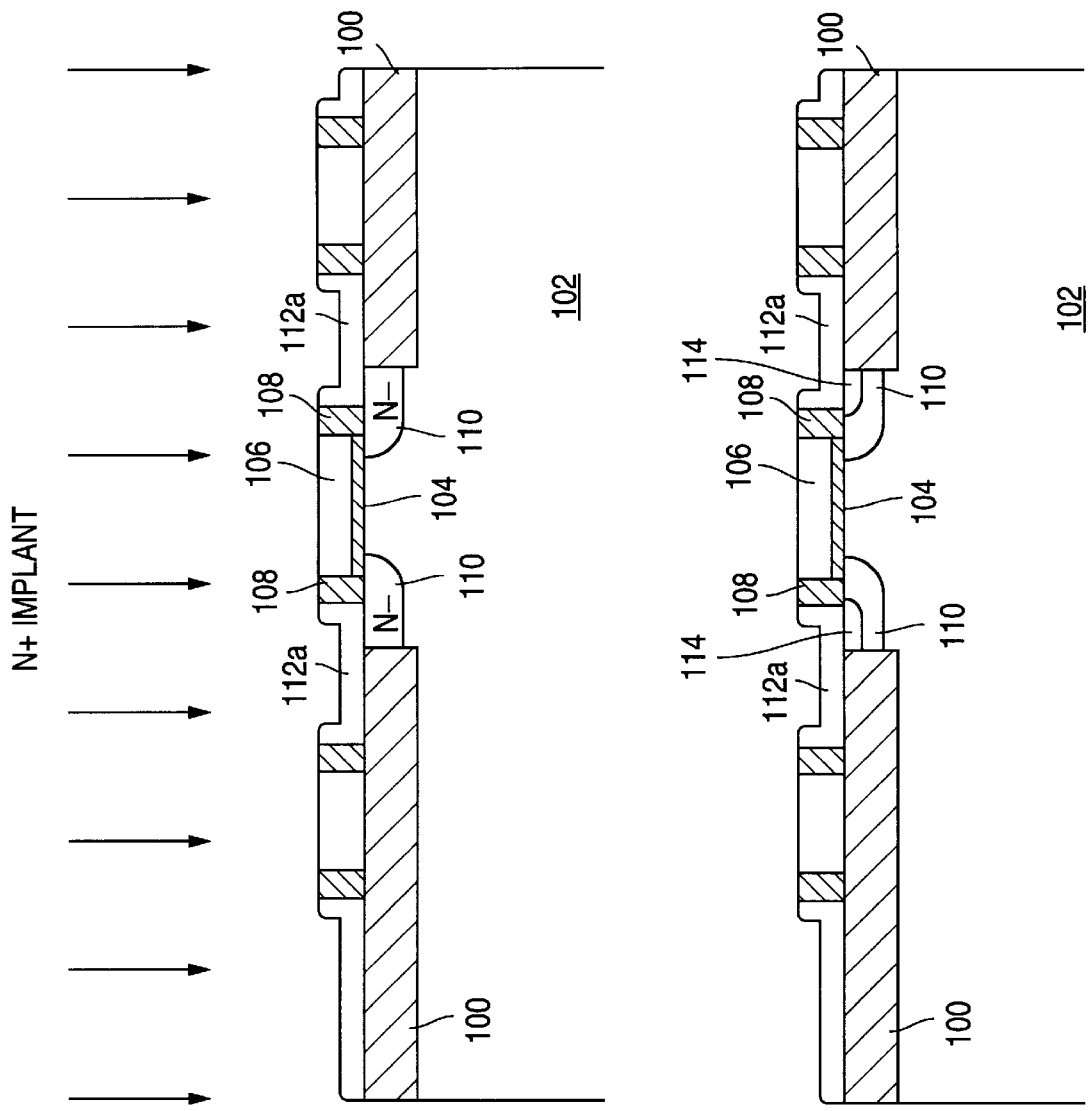

METHOD OF FABRICATING A CONTACT STRUCTURE FOR A RAISED SOURCE/ DRAIN MOSFET

BACKGROUND OF THE INVENTION

1. Field of the Invention

The present invention relates to fabrication techniques for integrated circuit elements and, in particular, to a process flow for fabricating a MOSFET using fully-salicided raised source/drain regions having contacts formed over isolation oxide.

2. Discussion of the Related Art

FIG. 1 shows a conventional MOSFET transistor 10 fabricated in an active device region of a semiconductor wafer substrate, the active device region being defined by field oxide regions in the conventional manner. In fabricating the MOSFET 10, a layer of polysilicon is formed on a layer of thin gate oxide formed on the surface of the substrate active device region. The polysilicon layer is then masked and both the exposed polysilicon and the underlying thin gate oxide are etched to define a polysilicon gate region 12 that is separated from the substrate by thin gate oxide 14. A self-aligned implant of N− type dopant then forms low density diffusion (LDD) regions in the substrate as a first phase in the formation of the MOSFET source/drain regions. After the formation of oxide sidewall spacers (SWS) 15 on the sidewalls of the polysilicon gate 12 and the gate oxide 14, a second N+ implant is performed to set the conductivity of the polysilicon gate region 12 to a desired level and to complete the N+ source/drain regions 16. Titanium is then deposited on the exposed upper surfaces of the N+ source/drain regions 16 and the polysilicon gate 12 and annealed, thereby causing the titanium to react with the underlying N+ silicon of the source/drain regions 16 and the doped polysilicon gate 12 to form titanium salicide 18 on these surfaces. A layer of dielectric material 20, typically silicon oxide, is then formed, contact openings are etched in the dielectric 20 and a metallization layer 22 is formed to provide contacts to the salicide 18 on the source/drain regions 16 and on the polysilicon gate 12, thereby completing the MOSFET structure.

The above-described MOSFET fabrication technique suffers from potential problems in the formation of the source/drain regions 16. First, selective growth of the salicide needed for good contacts with the metallization layer requires a reaction between the titanium and underlying silicon. Therefore, the titanium must be formed on the N+ source/drain regions 16, which must be wide enough to accommodate the photolithographic limitations of the contact opening; this results in a wider device. Also, since silicon is consumed in this process, the junction depth of the N+ source/drain regions 16 is difficult to control and dopant depletion can occur in these regions. Furthermore, formation of the deep, heavily-doped N+ junction for the source/drain regions 16 can result in dopant diffusion under the gate region, thereby reducing the effective channel length of the MOSFET, i.e. the so-called "short channel effect." Also, the titanium reacts differently with the single crystal source/drain substrate regions 16 and the polysilicon gate 12, resulting in different salicide thicknesses on the source/drain regions 16 and the gate 12.

SUMMARY OF THE INVENTION

The present invention provides a MOSFET design that utilizes raised source/drain regions in a way that significantly reduces the above-described problems, including the "short channel effect." The "short channel effect" is reduced because the source/drain N+ junction is formed inside the N− LDD region by outdiffusing from overlying polysilicon, after the N− LDD regions have been formed, during a Rapid Thermal Anneal (RTA) step. Poly2 is made thinner than poly1 so that all of the poly2 (except the poly2 sidewall material) is consumed during salicidation, thereby minimizing parasitic resistance, resulting in high speed devices. The raised source/drain regions extend over the field oxide, thereby allowing the source/drain junction areas to be much smaller; therefore, parasitic capacitances associated with the junctions are greatly reduced, also increasing device speed. The raised source/drain flow allows the use of high implant energies and doses without much impact on the short channel effect; therefore, dopant depletion into the titanium salicide is no longer an issue.

Specifically, the present invention provides a method of fabricating a MOSFET device structure in a silicon substrate wherein the MOSFET device structure includes planarized trench isolation field oxide regions formed in the substrate, a layer of gate oxide formed on the substrate to electrically insulate a polysilicon gate from the substrate, oxide sidewall spacers formed on sidewalls of the polysilicon gate and gate oxide, and LDD N− regions formed in the substrate adjacent the field oxide regions and beneath the sidewall spacers to define a channel region in the substrate beneath the polysilicon gate. In accordance with the method, a second layer of polysilicon is deposited over the above-described structure and a chemical mechanical polishing step is performed to self-align the polysilicon source/drain regions to the LDD N− substrate regions. The thickness of the second polysilicon layer is selected such that all of the poly2 on the trench and on the n+ substrate is consumed during a subsequent salicidation step, thereby causing minimized parasitic resistance, which results in high speed devices. N+ type dopant, preferably arsenic, is then implanted into the gate poly and into the raised source/drain poly regions. Next, a rapid thermal anneal step is performed to activate the N+ implant and to outdiffuse the N+ dopant from the polysilicon raised source/drain regions to form an N+ junction inside the N− LDD source/drain regions. A salicide oxide exclusion mask is then formed to protect the structure, with the exception of the polysilicon raised source/drain regions and the polysilicon gate. An amorphization step is then performed using heavy ion species to amorphize the exposed surfaces of the polysilicon gate and the raised poly source/drain regions. A titanium film is then sputter deposited at high temperature over the entire structure to form a first salicide phase (C49) in-situ. Unreacted titanium is then removed using a conventional wet selective etch and a dielectric layer is deposited and chemically mechanically polished to planarize the structure. The formation of the final titanium salicide phase (C54) is performed simultaneously with the densification of the dielectric layer. Finally, contact holes are opened in the dielectric layer and a metallization structure is deposited and patterned to form contacts with the titanium salicide.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 1 is a partial cross-sectional drawing illustrating a conventional MOSFET design.

FIGS. 2A–2L are partial cross-sectional drawings illustrating a sequence of steps for fabricating a raised source/ drain MOSFET in accordance with the concepts of the present invention.

DETAILED DESCRIPTION OF THE INVENTION

A process flow for fabricating a MOSFET device in accordance with the invention will now be described in conjunction with the partial cross-sectional drawings provided in FIGS. 2A–2L. While no specific process parameters are provided, those skilled in the art will appreciate that the concepts of the invention are applicable regardless of these parameters, which will differ depending upon the specific integrated circuit structure under manufacture. Those skilled in the art will also appreciate that, while the following discussion is directed to the fabrication of N-channel devices, the concepts of the invention apply to all MOSFET technologies.

Figure 1:
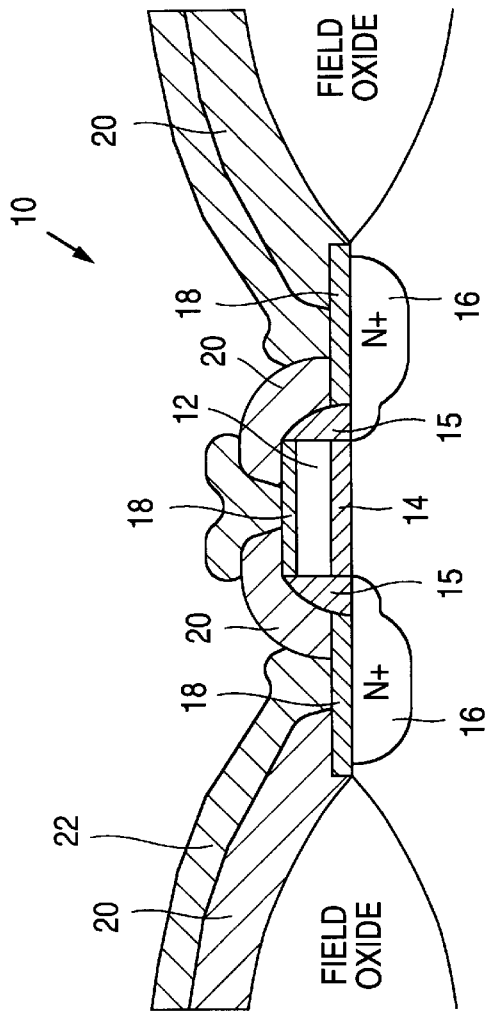
Figure 2A:
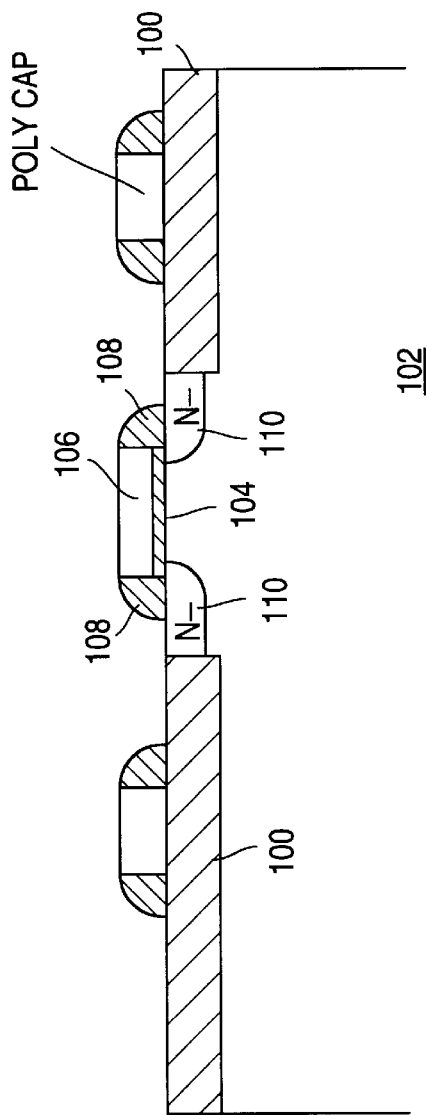

The initial fabrication sequence proceeds in a conventional manner through the formation of the trench isolated preliminary MOSFET structure shown in FIG. 2A. As shown in FIG. 2A, conventional planarized trench isolation field oxide regions 100 are formed in a silicon wafer 102. Thin gate oxide 104 is formed on the substrate 102 to electrically insulate an undoped polysilicon gate 106 from the substrate 102. Oxide sidewall spacers (SWS) 108 are formed on the sidewalls of the polysilicon gate 106 and the gate oxide 104. Low density diffusion (LDD) N– regions 110 are formed in the substrate 102 adjacent field oxide regions 100 and beneath the oxide sidewall spacers 108 to define a MOSFET channel region in the substrate 102 beneath the polysilicon gate 106.

As further shown in FIG. 2A, the first layer of polysilicon can also be utilized in the formation of polysilicon capacitors and thin film resistors (TFR) on the field oxide regions 100.

Figure 2B:
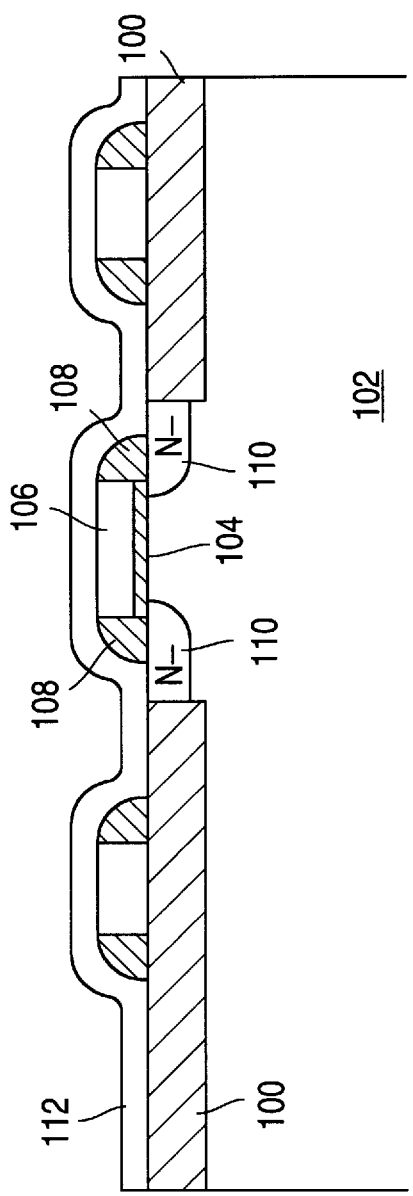
Figure 2C:
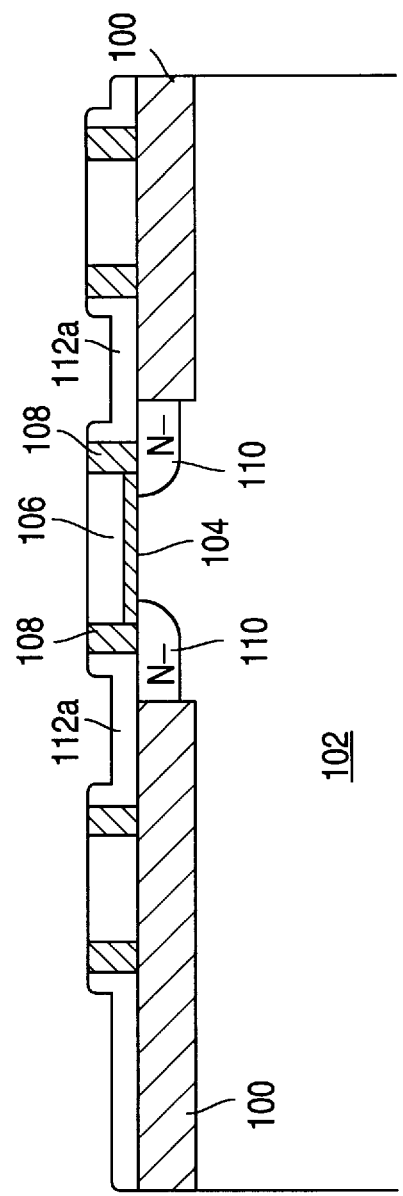

Referring to FIG. 2B, a second layer of polysilicon film 112 is then deposited over the FIG. 2A structure and a chemical mechanical polishing (CMP) step is performed to self-align the polysilicon raised source/drain regions 112a to the LDD N– source/drain substrate regions 110, resulting in the structure shown in FIG. 2C. It should be noted that the second polysilicon layer 112 is made thinner than the poly1 layer, the thickness being selected such that all of the poly2 forming the raised source/drain regions 112a is consumed during a subsequent salicidation step (described below). The minimized parasitic resistance resulting from complete poly2 consumption produces higher speed devices.

As shown in FIG. 2D, an N+ dopant, preferably arsenic, is then implanted into the gate polysilicon 106 and into the raised source/drain polysilicon regions 112a to dope these regions of exposed polysilicon to a desired level.

A rapid thermal processing (RTP) step is then performed to activate the N+ implant and to outdiffuse the N+ dopant from the polysilicon raised source/drain regions 112a to form an N+ junction 114 within the N– LDD source/drain regions 112a, resulting in the structure shown in FIG. 2E. It is noted that, since the N+ junction is formed inside the LDD N– substrate regions 110 by outdiffusing dopant from the raised poly regions 112a, the short channel effects experienced in the prior art processes are substantially reduced.

Figure 2F:
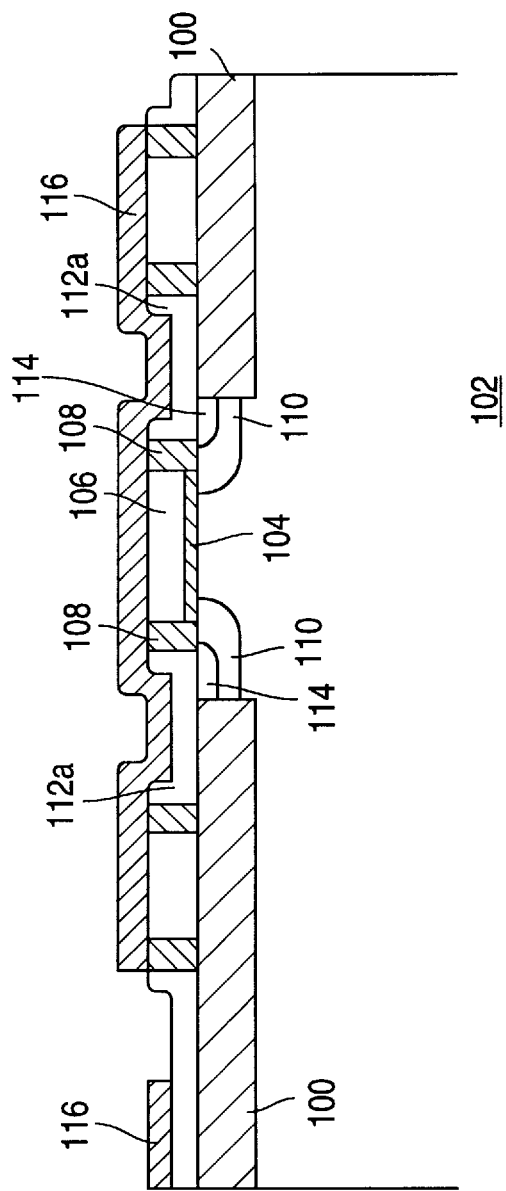

Referring to FIG. 2F, a photoresist mask 116 is then defined over the FIG. 2E structure to pattern a polysilicon thin film resistor (TFR) and, at the same time, to protect the source/drain polysilicon regions 112a. The unwanted polysilicon is then etched away and the photoresist mask 116 is removed, resulting in the structure shown in FIG. 2G.

Figure 2G:
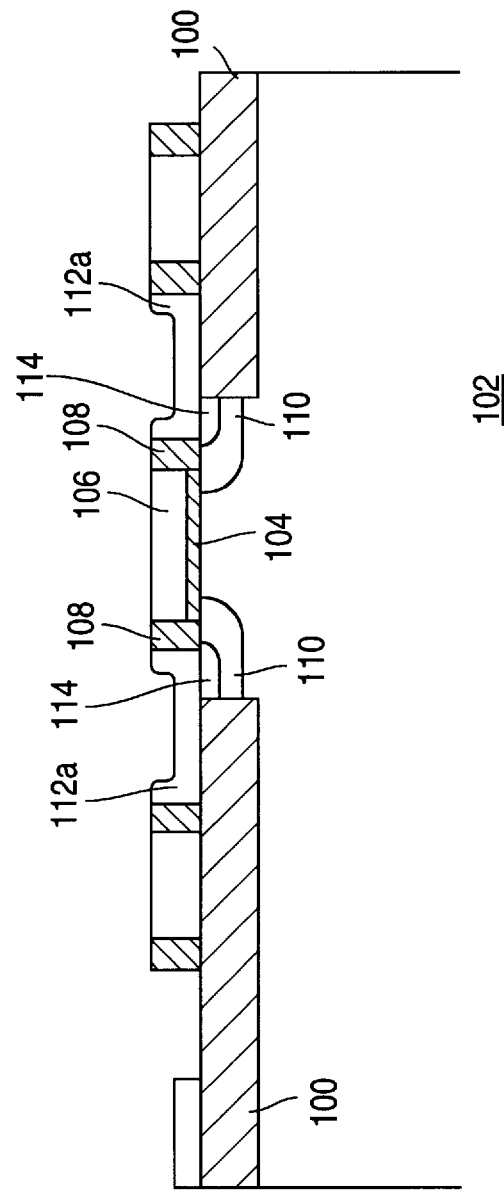
Figure 2H:
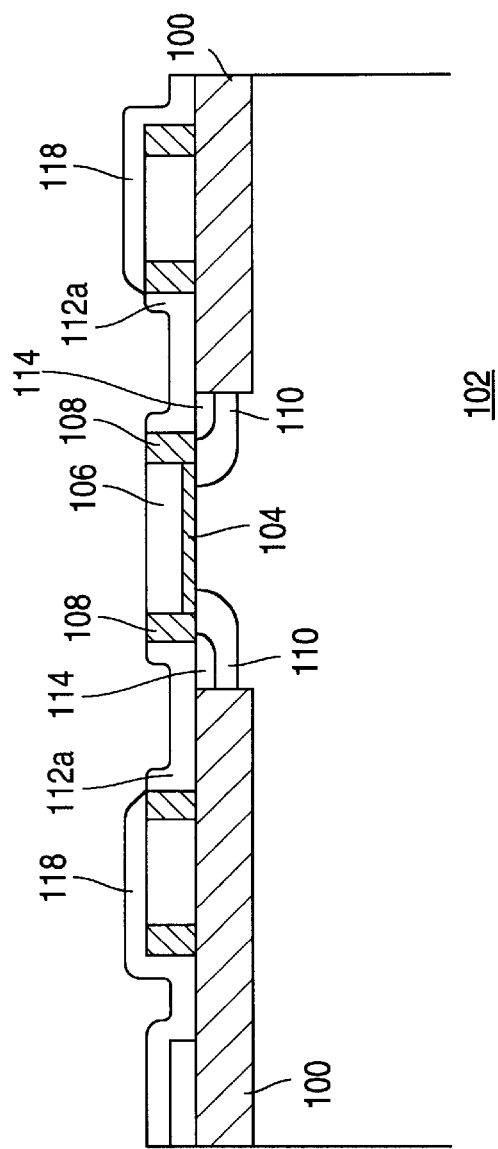

Next, as shown in FIG. 2H, a salicide oxide exclusion mask layer 118 is formed and etched to protect the FIG. 2G structure with the exception of the polysilicon raised source/drain regions 112a and the doped polysilicon gate 106, as shown in FIG. 2H.

An amorphization step using heavy ion species, e.g., gallium or arsenic, is then performed to amorphize the exposed polysilicon surfaces of the gate 106 and the raised source/drain regions 112a, prior to titanium deposition, in order to enhance the salicidation process and to overcome the narrow line salicidation problems.

Figure 2I:
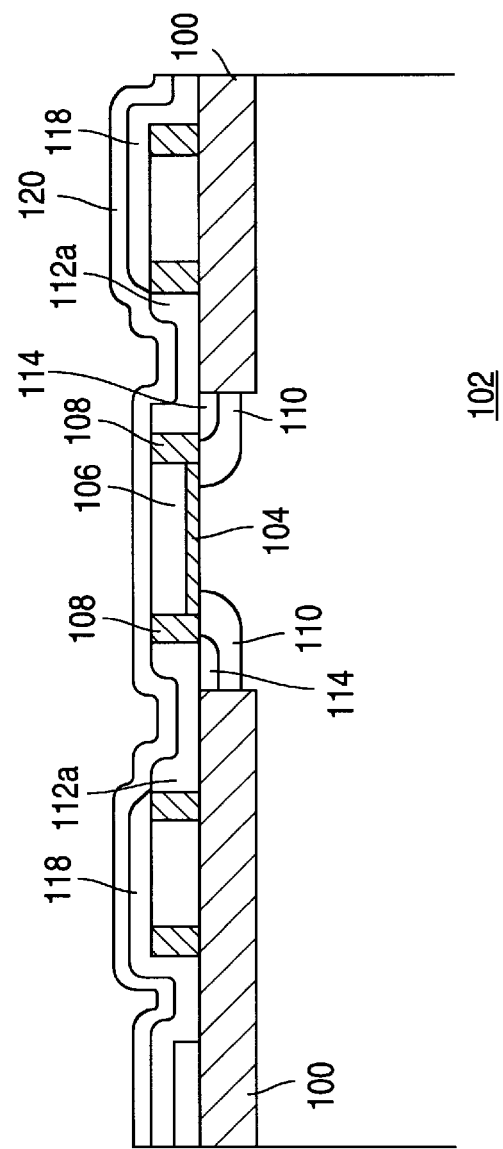
Figure 2J:
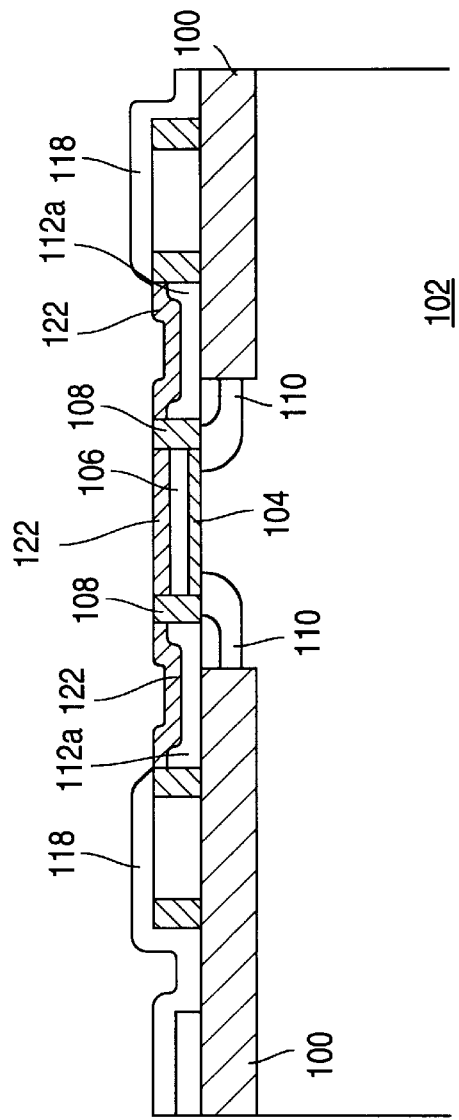

Next, as shown in FIG. 2I, a wet cleaning step is performed to remove any surface contamination and titanium film 120 is then deposited over the entire FIG. 2H structure. The titanium is sputter deposited at 400°–500° C. in order to form the first salicide phase (C49) in-situ. The unreacted titanium is then removed using a conventional wet selective etch, resulting in the structure shown in FIG. 2J. The formation of the final TiSi2 low resistivity phase (C54) is performed simultaneously with the densification of the first dielectric layer and, therefore, no additional RTP or furnace thermal process is required to form the salicide film. As stated above, all poly2 forming the raised source/drain regions 112a is consumed in TiSi2 formation. Densification is performed in the furnace in nitrogen at about 730 degrees C. for about 30 minutes.

Figure 2K:
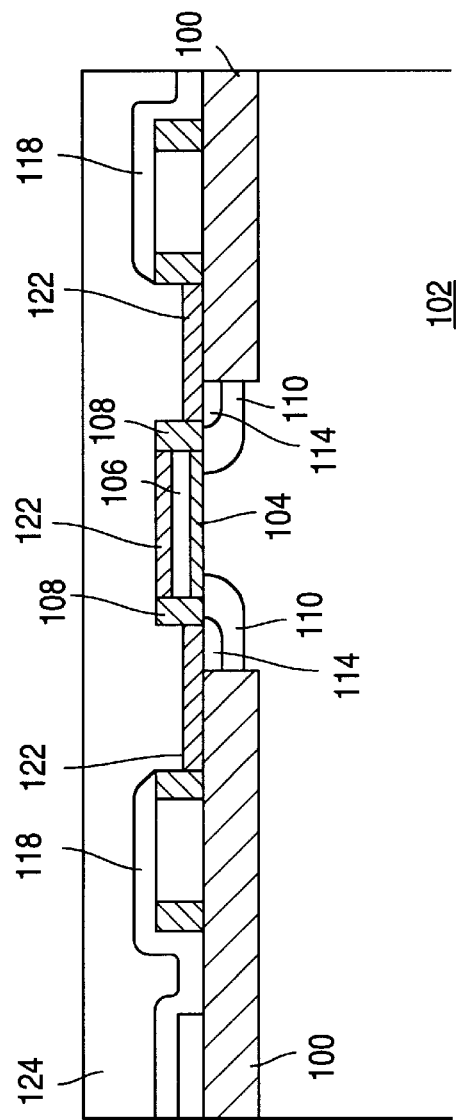

After removal of the unwanted titanium, a first dielectric layer 124, e.g. silicon oxide, is deposited and a chemical mechanical polishing (CMP) step is performed to planarize the structure, as shown in FIG. 2K.

Figure 2L:
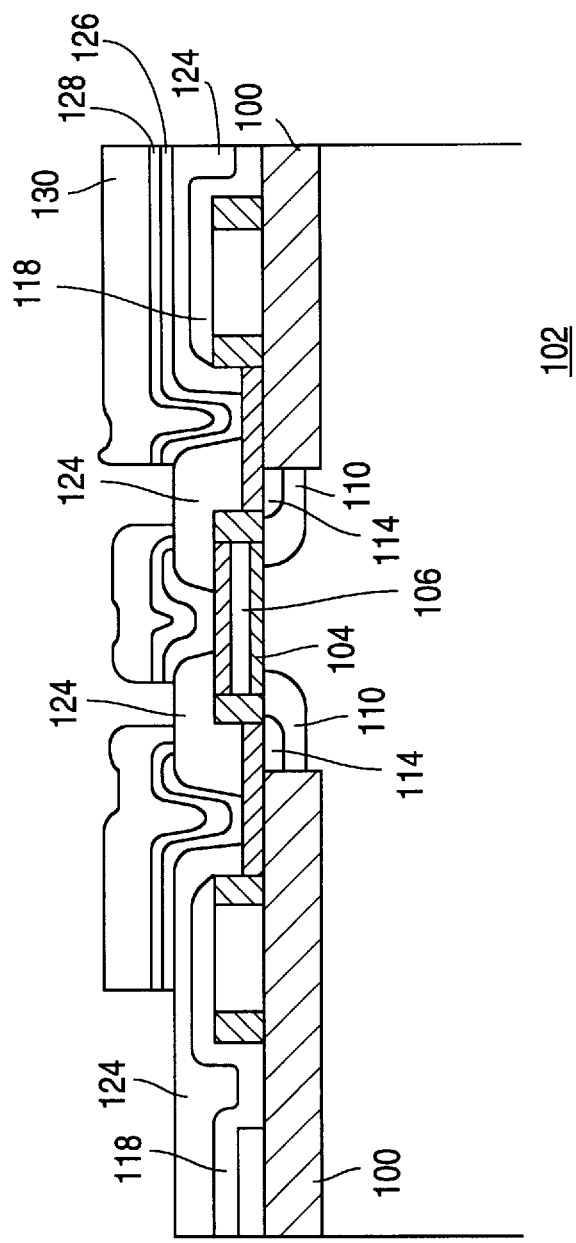

Finally, as shown in FIG. 2L, contact holes are opened in the dielectric layer 124 and a metallization structure is deposited to form contacts with the titanium salicide raised source/drain regions 122 and titanium salicide 122 on the polysilicon gate 106. In the embodiment of the invention illustrated in FIG. 2L, the contact metallization includes a first layer of titanium 126, a second layer of titanium nitride 128 and a final layer of aluminum 130.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method of fabricating a MOSFET device structure in a silicon substrate, wherein the MOSFET device structure includes planarized trench isolation field oxide regions formed in the substrate, a layer of gate oxide formed on the substrate to electrically insulate a polysilicon gate from the substrate, oxide sidewall spacers formed on sidewalls of the polysilicon gate and the gate oxide, LDD N– regions formed in the substrate adjacent to field oxide regions and beneath the sidewall spacers to define a channel region in the substrate beneath the polysilicon gate, the method comprising the steps of:

forming a second layer of polysilicon over the above-defined structure, the thickness of the second polysilicon layer being such that the second polysilicon layer is entirely consumed during a subsequent salicidation step;

performing a chemical mechanical polishing step to self-align the second polysilicon layer to the LDD N– source/drain substrate regions;

implanting N– type dopant into the gate polysilicon and into the raised source/drain polysilicon regions;

performing a rapid thermal processing step to activate the N+ implant and to outdiffuse N− type dopant from the polysilicon raised source/drain regions to form an N+ junction inside the N− LDD source/drain regions;

amorphizing a surface region of the gate polysilicon and the raised source/drain poly regions;

sputter depositing titanium to form a first salicide phase in-situ;

removing unreacted titanium;

forming a dielectric layer over the resulting structure formed after said removing unreacted titanium step and performing a chemical mechanical polishing step to planarize the dielectric layer;

densifying the dielectric layer, whereby a final salicide phase is obtained;

forming contact openings in the densified dielectric layer to expose the final phase titanium salicide raised source/drain regions and the final phase titanium salicide on the polysilicon gate; and forming a contact metallization layer in the contact openings to provide electrical contact to the final phase titanium salicide raised source/drain regions and to the final phase titanium salicide on the polysilicon gate.

2. A method as in claim 1 and wherein the step of sputter depositing titanium is peformed at 400–500 degrees Celsius.

* * * * *